(12) United States Patent
Pisek et al.

(10) Patent No.: US 8,218,518 B2
(45) Date of Patent: Jul. 10, 2012

(54) INTERLEAVER INTERFACE FOR A SOFTWARE-DEFINED RADIO SYSTEM

(75) Inventors: Eran Pisek, Plano, TX (US); Thomas M. Henige, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 879 days.

(21) Appl. No.: 11/750,742

(22) Filed: May 18, 2007

(65) Prior Publication Data

US 2008/0002657 A1 Jan. 3, 2008

Related U.S. Application Data

(60) Provisional application No. 60/812,696, filed on Jun. 9, 2006.

(51) Int. Cl.
*H04B 7/216* (2006.01)
(52) U.S. Cl. ............... 370/342; 455/342; 455/21
(58) Field of Classification Search .......... 455/342, 455/21; 379/248; 340/2.2–2.31, 14.1–14.69; 370/342
See application file for complete search history.

(56) References Cited

U.S. PATENT DOCUMENTS

| 5,063,533 | A  | * | 11/1991 | Erhart et al. ............... 711/157 |
| 6,415,414 | B1 | * | 7/2002  | Murayama et al. .......... 714/795 |
| 7,185,260 | B2 | * | 2/2007  | Coombs et al. ............. 714/755 |
| 2004/0117713 | A1 | * | 6/2004 | Cameron .................... 714/755 |
| 2004/0190552 | A1 | * | 9/2004 | Kim et al. .................... 370/469 |
| 2004/0225949 | A1 | * | 11/2004 | Coombs et al. ............. 714/796 |
| 2004/0240590 | A1 | * | 12/2004 | Cameron et al. ............ 375/340 |
| 2005/0154954 | A1 | * | 7/2005 | Maru ............................ 714/746 |
| 2005/0157685 | A1 | * | 7/2005 | Gu et al. ...................... 370/335 |
| 2005/0193308 | A1 | * | 9/2005 | Shin ............................ 714/752 |
| 2006/0280158 | A1 | * | 12/2006 | Lo et al. ...................... 370/342 |

* cited by examiner

*Primary Examiner* — Jean Gelin
*Assistant Examiner* — Michael Nguyen

(57) ABSTRACT

A software-defined radio (SDR) system that operates under a plurality of wireless communication standards. The SDR system comprises a reconfigurable maximum aposteriori probability (MAP) decoder capable of being configured under software control to decode a received data block according to a select wireless communication standard and a reconfigurable interleaver associated with the reconfigurable MAP decoder. The reconfigurable interleaver comprises a reconfigurable interleaver core circuitry capable of being configured under software control to operate according to the selected wireless communication standard and a unified interleaver interface for coupling a defined set of control and bus signals from the reconfigurable MAP decoder to the reconfigurable interleaver core circuitry.

18 Claims, 5 Drawing Sheets

INTERLEAVER INTERFACE FOR A SOFTWARE-DEFINED RADIO SYSTEM

CROSS-REFERENCE TO RELATED APPLICATIONS AND CLAIM OF PRIORITY

This application is related to U.S. Provisional Patent No. 60/812,696, filed Jun. 9, 2006, entitled "Method And Apparatus For Interleaver Plug-In". Provisional Patent No. 60/812,696 is assigned to the assignee of this application and is incorporated by reference as if fully set forth herein. This application claims priority under 35 U.S.C. §119(e) to Provisional Patent No. 60/812,696.

TECHNICAL FIELD OF THE INVENTION

The present application relates generally to a reconfigurable turbo decoder and, more specifically, to an interleaver apparatus for use with reconfigurable turbo decoders in software-defined radio (SDR) systems.

BACKGROUND OF THE INVENTION

Many wireless and wireline communication standards use block coding schemes (or algorithms) to increase the performance of channel decoding operations. One very popular block coding scheme is the turbo coding algorithm, which is implemented in many cellular standard receivers and WiMax receivers. Turbo coding is a powerful forward error correction (FEC) algorithm that achieves a coding gain close to the Shannon limit. Turbo encoders and turbo decoders have been adopted for use in the physical layers of a number of wireless standards, including WCDMA, CDMA2000, IEEE-802.16e (i.e., WiBro) and others.

A software-defined radio (SDR) device uses reconfigurable hardware that may be programmed over-the-air to operate under different wireless standards. For example, an SDR transceiver in a wireless laptop computer or PDA may be configured by different software loads to operate in an IEEE-802.11x wireless network, a CDMA2000 wireless network, an OFDM/OFDMA wireless network, a GSM wireless network, or other types of networks. Many of these wireless standards require encoders and decoders, including turbo encoders and decoders, that are capable of being reconfigured according the selected wireless standard.

However, the performance of a turbo decoder is highly dependent on the interleaver (I/L) method of the coded bits. Each wireless (or wireline) standard defines different methods to calculate (or perform) the interleaver function. By way of example, the interleaver address is used to determine the lambda location in the interleaved maximum aposteriori probability (MAP) session.

Conventional turbo decoders incorporate a MAP decoder that is coupled to the interleaver block. There are a number of conventional methods to implement the interleaver block, such as by an interleaver hardware (HW) machine or an interleaver memory look-up table (LUT). Conventional turbo decoder implementations select one of those ways and define a special handshake or interface between the MAP decoder and the interleaver block. Because different turbo code solutions and different interleaver functions are implemented in different standards, each interleaver interface (I/F) is different from the other interleaver interfaces. Thus, the interface for an interleaver hardware machine would not be able to couple to a MAP decoder that is suited to an interleaver memory LUT, and vice versa. This creates a problem in the case of a unified SDR turbo (MAP) decoder that supports multi-standards with multi-block sizes, since the same unified SDR MAP decoder interface may not be coupled to both an interleaver hardware machine and an interleaver memory look-up table (LUT).

Therefore, there is a need in the art for an improved interleaver interface for use in a reconfigurable decoder in a software-defined radio (SDR) system. In particular, there is a need for an interleaver interface that couples to a reconfigurable turbo decoder that operates under different wireless standards.

SUMMARY OF THE INVENTION

An advantageous embodiment of the present disclosure provides a software-defined radio (SDR) system that operates under a plurality of wireless communication standards. The SDR system comprises 1) a reconfigurable maximum aposteriori probability (MAP) decoder capable of being configured under software control to decode a received data block according to a selected one of the plurality of wireless communication standards; and 2) a reconfigurable interleaver associated with the reconfigurable MAP decoder. The reconfigurable interleaver comprises: i) a reconfigurable interleaver core circuitry capable of being configured under software control to operate according to the selected wireless communication standard; and ii) a unified interleaver interface for coupling a defined set of control and bus signals from the reconfigurable MAP decoder to the reconfigurable interleaver core circuitry.

In another advantageous embodiment, a reconfigurable turbo decoder that operates under a plurality of wireless communication standards is provided. The reconfigurable turbo decoder comprises: 1) a reconfigurable maximum aposteriori probability (MAP) decoder capable of being configured under software control to decode a received data block according to a selected one of the plurality of wireless communication standards; and 2) a reconfigurable interleaver associated with the reconfigurable MAP decoder. The reconfigurable interleaver comprises: i) a reconfigurable interleaver core circuitry capable of being configured under software control to operate according to the selected wireless communication standard and ii) a unified interleaver interface for coupling a defined set of control and bus signals from the reconfigurable MAP decoder to the reconfigurable interleaver core circuitry.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged processing system.

The present disclosure provides a unified interleaver (I/L) interface that supports the different interleaver methods (or apparatuses) used in different wireless communication standards. This enables any conventional reconfigurable turbo decoder to be coupled to a reconfigurable interleaver circuit that may be configured by a software load to be a hardware (HW) machine interleaver, a RAM-based interleaver, a ROM look-up table (LUT)-based interleaver, or the like.

In an exemplary embodiment of the disclosure, the reconfigurable turbo decoder described herein may be implemented according to the principles of the reconfigurable turbo decoder described in U.S. patent application Ser. No. 11/225,479, filed Sep. 13, 2005, and entitled "Turbo Decoder Architecture For Use In Software-Defined Radio Systems". U.S. patent application Ser. No. 11/225,479 is hereby incorporated by reference as if fully set forth herein.

Figure 1:
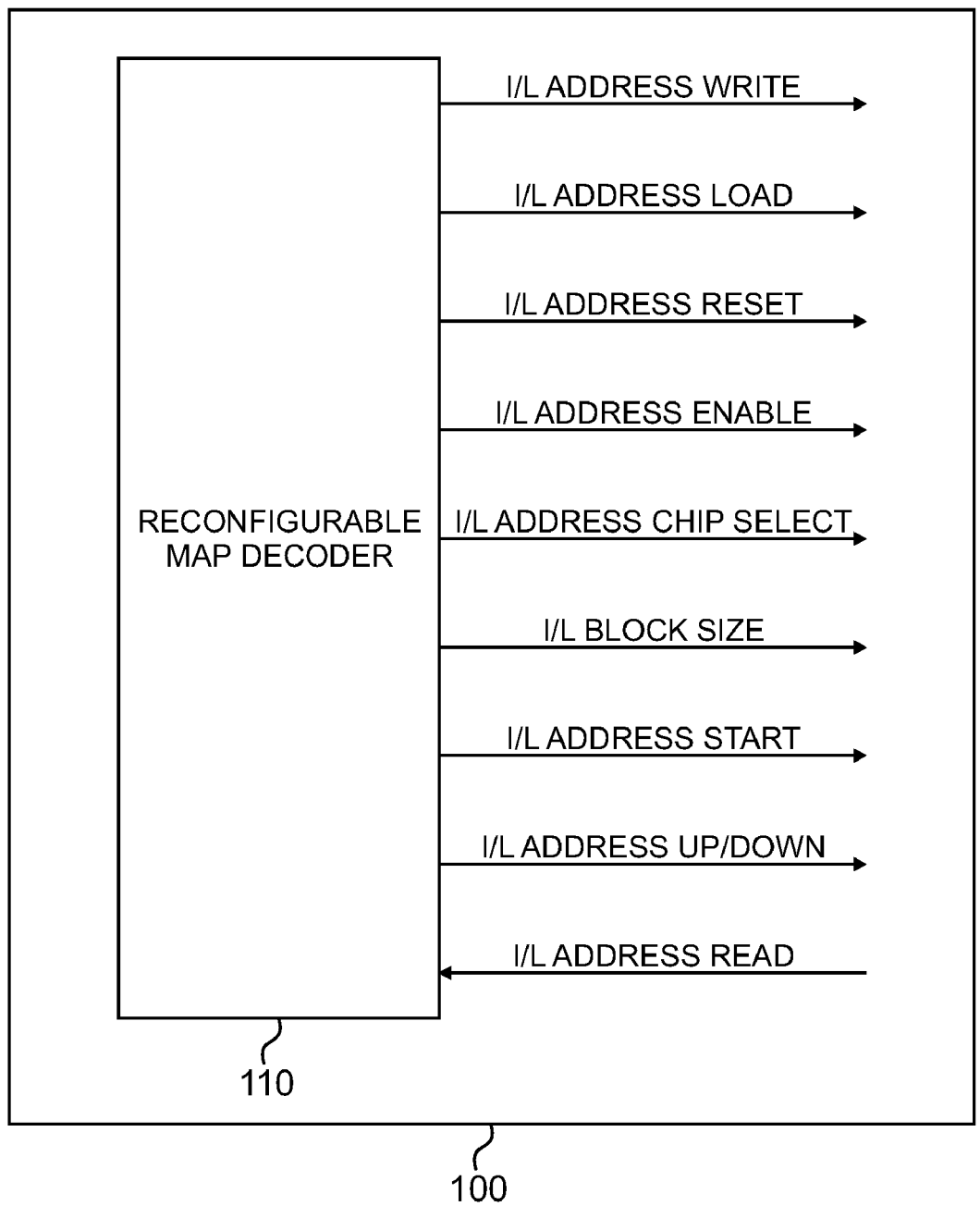
FIG. 1 is a block diagram of a reconfigurable turbo decoder having a reconfigurable MAP decoder core that couples with a reconfigurable interleaver circuit using a standard interface according to the principles of the present disclosure.

FIG. 1 is a high-level block diagram of reconfigurable turbo decoder 100, which comprises reconfigurable maximum aposteriori probability (MAP) decoder 110 that interfaces with a reconfigurable interleaver circuit according to the principles of the present disclosure. The relevant control and address lines (or signals) of reconfigurable MAP decoder 110 are the Interleaver (I/L) Address Write signal, the Interleaver (I/L) Address Load signal, the Interleaver (I/L) Address Reset signal, the Interleaver (I/L) Address Enable signal, the Interleaver (I/L) Address Chip Select signal, the Interleaver (I/L) Block Size signal, the Interleaver (I/L) Address Start signal, the Interleaver (I/L) Address Up/Down signal, and the Interleaver (I/L) Address Read signal. These signals are applicable to all of the coupling methods between the reconfigurable MAP decoder 110 and the reconfigurable interleaver block.

Each one of the Interleaver Address Write signal, the Interleaver Address Chip Select signal, the Interleaver Block Size signal, and the Interleaver Address Read signal may comprise a set of signals (i.e., a bus signal) rather than a single signal line. Additionally, the Interleaver Block Size signal may be any parameter(s) that represent the block size of the data block that is being decoded. The Interleaver Address Chip Select signal may be any set of signals that differentiate between interleaver tables.

Figure 2:
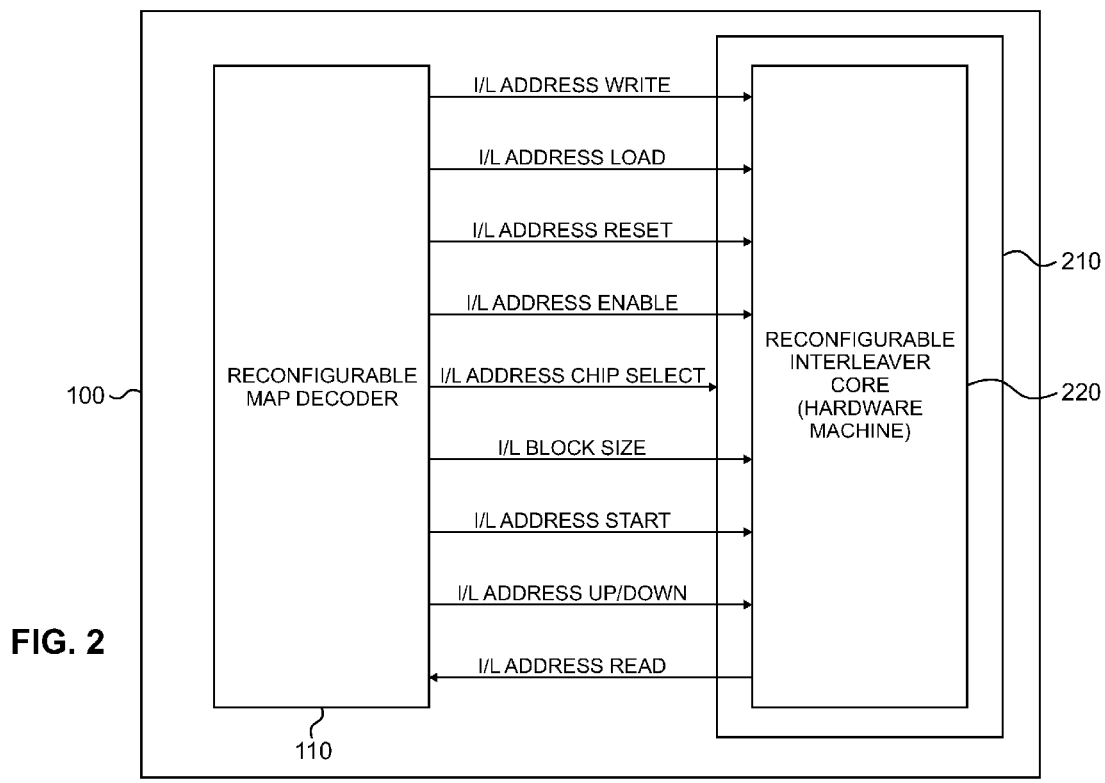
FIG. 2 illustrates the coupling of the reconfigurable MAP decoder and the reconfigurable interleaver using a standard interface according to a first embodiment of the disclosure.

FIG. 2 illustrates the interface between reconfigurable MAP decoder 110 and reconfigurable interleaver 210 according to a first embodiment of the present disclosure. In FIG. 2, a software load has been used to configure reconfigurable interleaver core circuit 220 of interleaver 210 to operate as a hardware machine. The interface of interleaver 210 couples to all of the signals from MAP decoder 110 in FIG. 1, except for Interleaver Address Chip Select.

For a hardware machine interleaver, the Interleaver Address Write bus signal is used to synchronize the hardware machine with the required Lambda location. The Interleaver Address Write bus signal is sampled when the Interleaver Address Load signal is asserted while the Interleaver Address Enable and Interleaver Address Start signals are set. The hardware machine interleaver will automatically calculate the next I/L address as long as the Interleaver Address Enable signal is set.

The Interleaver Block Size signals determine the hardware machine interleaver parameters, which differ from standard to standard. The Interleaver Address Reset signal is used to reset the hardware machine interleaver to an initial state. The Interleaver Address Up/Down signal determines the method for calculating the interleaver address for an Alpha session (up) or a Beta session (down), or vice versa. The Interleaver Address Read bus signal is read back to MAP decoder 110.

Figure 3:
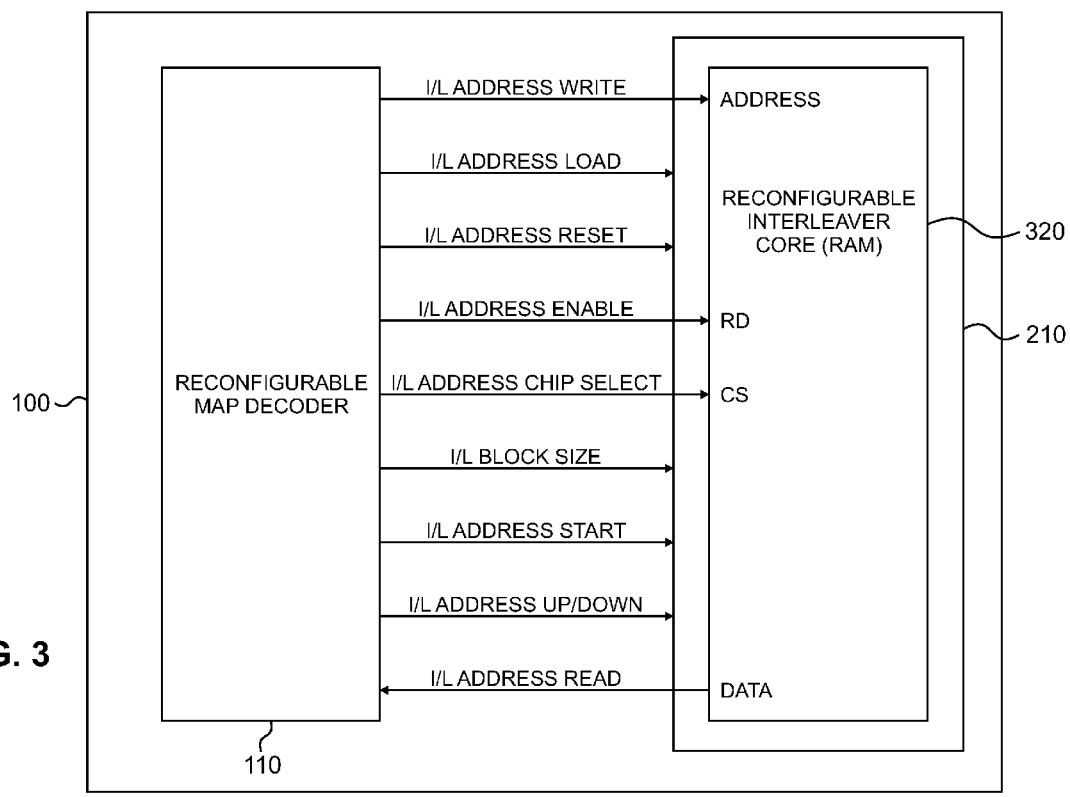
FIG. 3 illustrates the coupling of the reconfigurable MAP decoder and the reconfigurable interleaver using a standard interface according to a second embodiment of the disclosure.

FIG. 3 illustrates the interface between reconfigurable MAP decoder 110 and reconfigurable interleaver 210 according to a second embodiment of the present disclosure. In FIG. 3, a software load has been used to configure reconfigurable interleaver core circuit 320 of interleaver 210 to operate as a random access memory (RAM) based interleaver.

The unified interface of interleaver 210 couples the Interleaver Address Write bus to the Address input of interleaver core circuit 320. The unified interface of interleaver 210 couples the Interleaver Address Read bus to the Data output of interleaver core circuit 320. Also, the Interleaver Address Enable signal and Interleaver Address Chip Select bus signal are used by interleaver core circuit 320.

Figure 4:
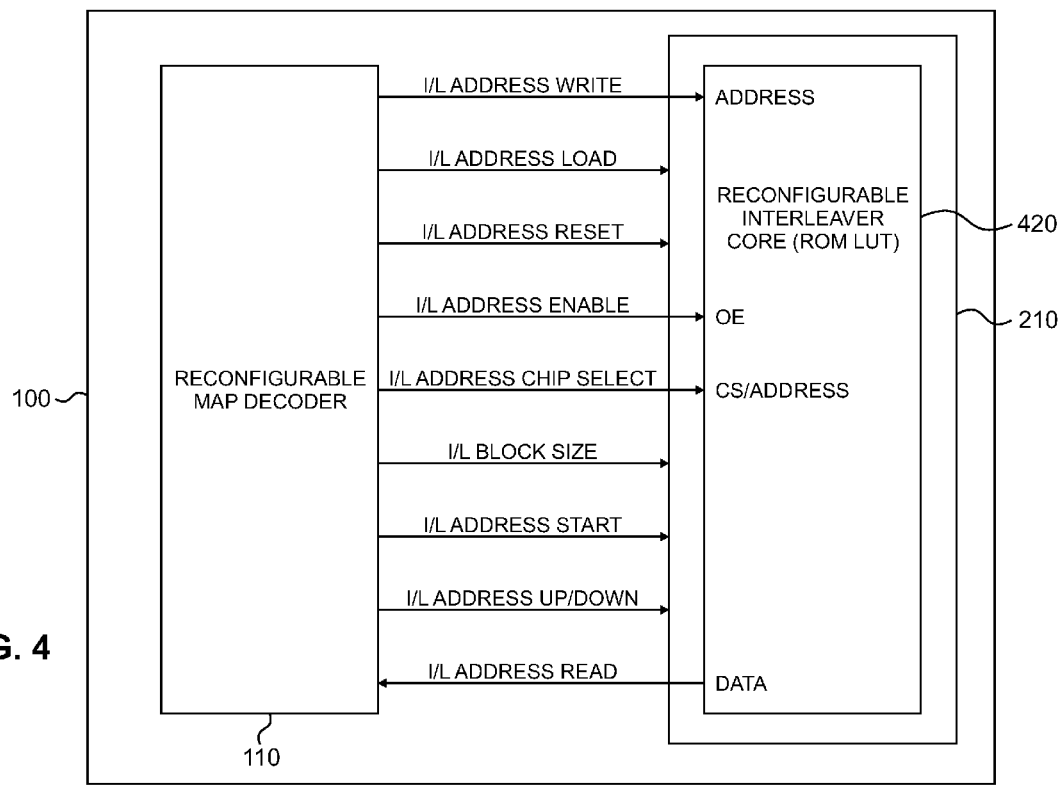
FIG. 4 illustrates the coupling of the reconfigurable MAP decoder and the reconfigurable interleaver using a standard interface according to a third embodiment of the disclosure.

FIG. 4 illustrates the interface between reconfigurable MAP decoder 110 and reconfigurable interleaver 210 according to a third embodiment of the present disclosure. In FIG. 4, a software load has been used to configure reconfigurable interleaver core circuit 420 of interleaver 210 to operate as a read-only memory (ROM) look-up table (LUT) based interleaver. Similar to FIG. 3, the interleaver core circuit 420 uses the Interleaver Address Write bus, the Interleaver Address Read bus, the Interleaver Address Enable signal and the Interleaver Address Chip Select bus signal. These signals are used by the Address, Data, Output Enable (OE), and Chip Select/Address inputs/outputs of the interleaver core circuit 420.

Figure 5:
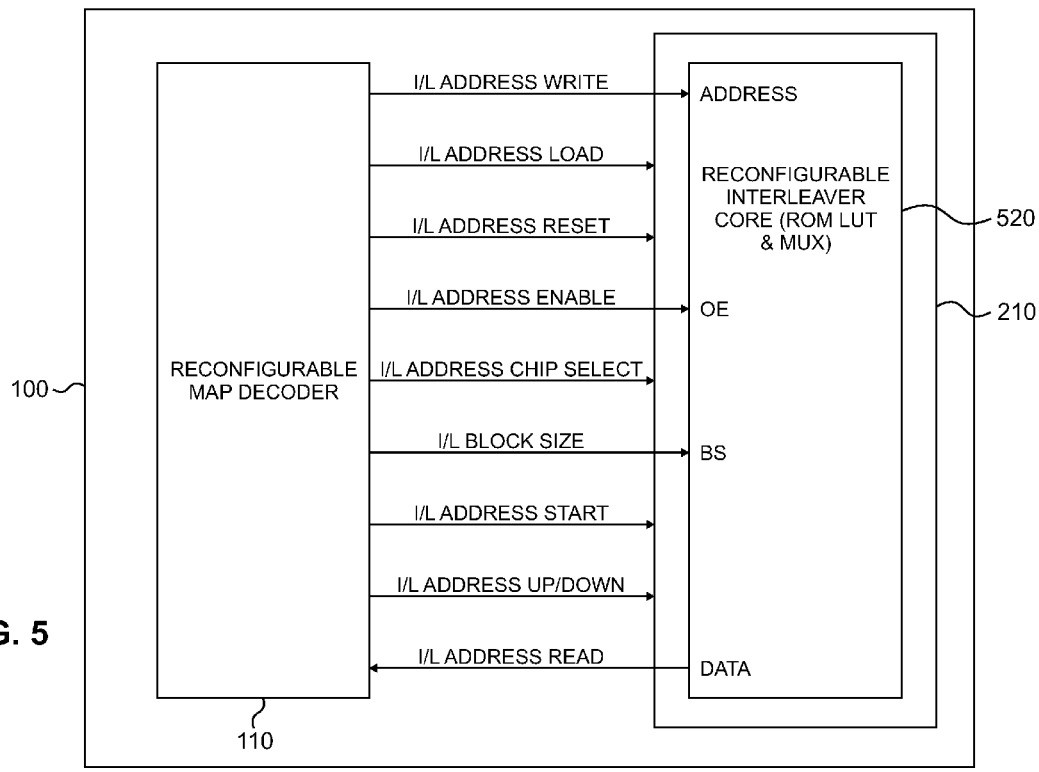
FIG. 5 illustrates the coupling of the reconfigurable MAP decoder and the reconfigurable interleaver using a standard interface according to a fourth embodiment of the disclosure.

It is also possible to couple the Block Size parameters to the ROM LUT configuration. This requires the addition of multiplexer (MUX) logic in the ROM LUT in order to distinguish between the different block size interleaver tables. FIG. 5 illustrates such an embodiment.

The advantage in the proposed unified interleaver interface is that it is now possible to couple a reconfigurable interleaver core circuit that implements any kind of hardware machine-based interleaver or memory-based interleaver to a reconfigurable turbo decoder and easily switch between standards that use different interleaver tables. Also, the unified interleaver interface gives the designer the freedom to choose between power savings and die space savings (i.e., HW machine or ROM approaches) and interleaver flexibility (i.e., RAM approach) for various standards and block sizes.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A reconfigurable turbo decoder that operates under a plurality of wireless communication standards, the reconfigurable turbo decoder comprising:
   a reconfigurable maximum aposteriori probability (MAP) decoder configured under software control to decode a received data block according to a selected one of the plurality of wireless communication standards and configured to generate a set of control and bus signals, wherein the set of control and bus signals comprises a block size signal associated with the received data block; and
   a unified interleaver interface configured to couple a defined subset of the control and bus signals from the reconfigurable MAP decoder to a reconfigurable interleaver core circuitry configured to operate according to the selected wireless communication standard, wherein the defined subset of control and bus signals is defined based on the selected wireless communication standard, and wherein the unified interleaver interface is configured to support a set of interleaver methods comprising a memory-based interleaver and a hardware machine-based interleaver.

2. The reconfigurable turbo decoder as set forth in claim 1, wherein the defined subset of control and bus signals comprises an address write bus and an address read bus.

3. The reconfigurable turbo decoder as set forth in claim 2, wherein the defined subset of control and bus signals comprises a chip select signal.

4. The reconfigurable turbo decoder as set forth in claim 1, wherein the reconfigurable interleaver core circuitry may be configured to operate as one of the memory-based interleaver and the hardware machine-based interleaver.

5. The reconfigurable turbo decoder as set forth in claim 4, wherein the reconfigurable interleaver core circuitry may be configured to operate as a random access memory (RAM)-based interleaver.

6. The reconfigurable turbo decoder as set forth in claim 4, wherein the reconfigurable interleaver core circuitry may be configured to operate as a read-only memory (ROM)-based interleaver.

7. The reconfigurable turbo decoder as set forth in claim 6, wherein the ROM-based interleaver comprises a look-up table (LUT).

8. The reconfigurable turbo decoder as set forth in claim 1, wherein the reconfigurable turbo decoder is disposed in a software-defined radio system.

9. The reconfigurable turbo decoder as set forth in claim 8, wherein the plurality of wireless communication standards comprises at least one of WCDMA, CDMA2000, IEEE-802.16e, and WiMAX.

10. A software-defined radio (SDR) system that operates under a plurality of wireless communication standards, the SDR system comprising:
    a reconfigurable maximum aposteriori probability (MAP) decoder that is configurable to decode a received data block according to a selected one of the plurality of wireless communication standards and configured to generate a plurality of signals, wherein the signals comprise a block size signal associated with the received data block; and
    a unified interleaver interface comprising a reconfigurable interleaver core circuitry that is configurable by a software load to operate based on the selected wireless communication standard, wherein the unified interleaver interface is configured to receive the signals from the reconfigurable MAP decoder and to provide at least a subset of the received signals from the reconfigurable MAP decoder to the reconfigurable interleaver core circuitry based on the selected wireless communication standard.

11. The software-defined radio (SDR) system as set forth in claim 10, wherein the signals comprise an address write bus and an address read bus.

12. The software-defined radio (SDR) system as set forth in claim 11, wherein the signals comprise a chip select signal.

13. The software-defined radio (SDR) system as set forth in claim 10, wherein the reconfigurable interleaver core circuitry may be configured to operate as one of a memory-based interleaver and a hardware machine-based interleaver.

14. The software-defined radio (SDR) system as set forth in claim 13, wherein the reconfigurable interleaver core circuitry may be configured to operate as a random access memory (RAM)-based interleaver.

15. The software-defined radio (SDR) system as set forth in claim 13, wherein the reconfigurable interleaver core circuitry may be configured to operate as a read-only memory (ROM)-based interleaver.

16. The software-defined radio (SDR) system as set forth in claim 15, wherein the ROM-based interleaver comprises a look-up table (LUT).

17. The software-defined radio (SDR) system as set forth in claim 16, wherein the plurality of wireless communication standards comprises at least one of WCDMA, CDMA2000, IEEE-802.16e, and WiMAX.

18. The software-defined radio (SDR) system as set forth in claim 16, further comprising a reconfigurable turbo decoder that operates under a plurality of wireless communication standards, wherein the reconfigurable MAP decoder and the unified interleaver interface are included in the reconfigurable turbo decoder.

* * * * *